United States Patent [19]

Suyama et al.

[11] Patent Number: 4,862,470

[45] Date of Patent: Aug. 29, 1989

[54] SEMICONDUCTOR LASER DEVICE

[75] Inventors: Takahiro Suyama, Tenri; Kosei Takahashi, Nara; Masafumi Kondo, Tenri; Toshiro Hayakawa, Nara, all of Japan

[73] Assignee: Sharp Kabushiki Kaisha, Osaka, Japan

[21] Appl. No.: 186,818

[22] Filed: Apr. 27, 1988

[30] Foreign Application Priority Data

Apr. 28, 1987 [JP] Japan .................................. 62-105612

[51] Int. Cl.$^4$ .................................................. H01S 3/19
[52] U.S. Cl. ........................................... 372/45; 372/46
[58] Field of Search ................ 372/45, 44; 11/43, 46; 357/16, 17

[56] References Cited

U.S. PATENT DOCUMENTS

| 4,361,802 | 12/1986 | Hayashi et al. | 372/45 |
| 4,366,569 | 12/1982 | Hirao et al. | 372/46 |
| 4,416,012 | 12/1983 | Botez et al. | 372/45 |
| 4,480,331 | 10/1984 | Thompson | 372/45 |
| 4,512,022 | 4/1985 | Tsang | 372/45 |
| 4,573,161 | 2/1986 | Sakai et al. | 372/45 |
| 4,635,268 | 1/1987 | Motegi et al. | 372/45 |
| 4,745,612 | 5/1988 | Hayakawa et al. | 372/45 |
| 4,750,183 | 6/1988 | Takahashi et al. | 372/45 |
| 4,757,510 | 6/1988 | Kaheno et al. | 372/45 |

FOREIGN PATENT DOCUMENTS

| 0044571 | 1/1982 | European Pat. Off. |
| 0125738 | 11/1984 | European Pat. Off. |
| 0206496 | 12/1986 | European Pat. Off. |
| 0210616 | 2/1987 | European Pat. Off. |
| 0215298 | 3/1987 | European Pat. Off. |
| 5948976 | 3/1984 | Japan |
| 61207090 | 9/1986 | Japan |
| 1378128 | 12/1974 | United Kingdom |
| 2100501 | 12/1982 | United Kingdom |

OTHER PUBLICATIONS

Smith, Jul./Aug. 1986, Xerox Disclosure Journal 11(4)151–152.
Hayakawa et al., (1986) Applied Physics Letters 49(11):636–638.
Patent Abstracts of Japan (11/29/85) 9(302), E-362,2025, Ap. No.58-250138.
Patent Abstracts of Japan (6/28/84) 8(139), E-253,1576, Appln. No. 57-1600545.
Patent Abstracts of Japan (11/22/84), 8(256), E-280, 1693, Appln. No. 59-127893.
Kurobe et al., (1986) Electronics Letters 22 (21):1117–1118.

Primary Examiner—William L. Sikes
Assistant Examiner—Georgia Y. Epps
Attorney, Agent, or Firm—Irell & Manella

[57] ABSTRACT

A semiconductor laser device comprising an active layer, optical guiding layers sandwiching the active layer therebetween, and a cladding layer disposed on each of the optical guiding layers, wherein the refractive index of each of the optical guiding layers gradually varies in the direction of the thickness of the optical guiding layer, and the thickness of each of the cladding layers is 0.5 um or less.

3 Claims, 1 Drawing Sheet

FIG.1
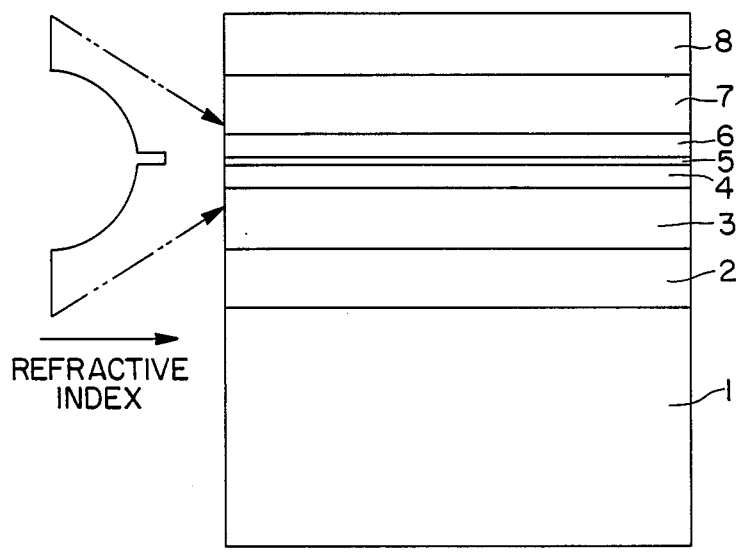
REFRACTIVE INDEX →
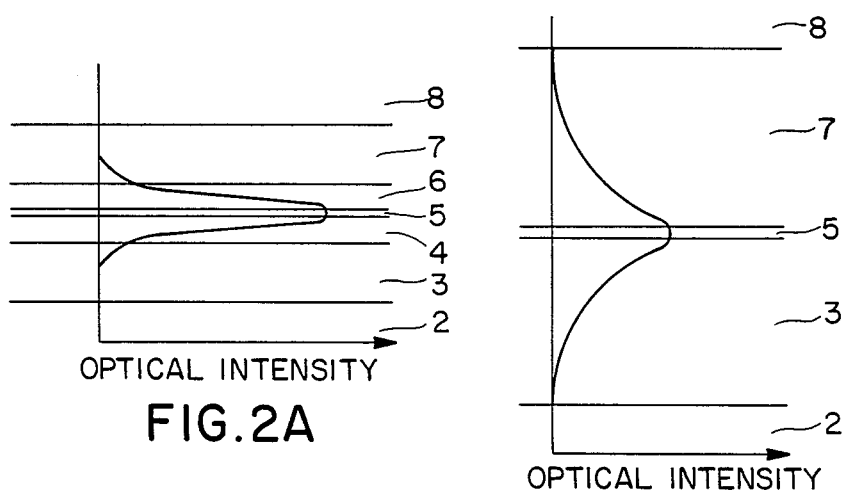
OPTICAL INTENSITY
FIG.2A
OPTICAL INTENSITY
FIG.2B

SEMICONDUCTOR LASER DEVICE

BACKGROUND OF THE INVENTION

1. Field of the Invention

This invention relates to a semiconductor laser device. More particularly, it relates to a GRINSCH (Graded Index-SCH) semiconductor laser device with a superlatticed structure having an optical guiding layer between the active layer and each of the first and second cladding layers.

2. Description of the Prior Art:

In recent years, with the advance of crystal growth techniques, it has become possible to form extremely thin crystals, and quantum well semiconductor laser devices with a superlatticed structure have been developed. The quantum well semiconductor laser devices are advantageous over conventional doublehetero (DH) junction-type semiconductor laser devices in that the said quantum well semiconductor laser devices can attain laser oscillation at a low threshold current level. On the contrary, the quantum well semiconductor laser devices are disadvantageous in that they must have an active layer with a thickness of as thin as 100 Å or less. Such an thin layer has not yet been formed by liquid phase epitaxy, but it has been formed by molecular beam epitaxy or metal-organic chemical vapor deposition. However, when the growth rate of layers in a molecular beam epitaxial growth process or a metal-organic chemical vapor deposition growth process is set at an exceedingly high level, good quality crystal layers cannot be obtained. Accordingly, for example, a growth rate of about 1 $\mu$m/hour is typically used for molecular beam epitaxy. In conventional DH-type semiconductor laser devices that are made of the $Al_x Ga_{1-x}As$ system (x is the AlAs mole fraction), the substrate and/or the cap layer generally function as a light-absorbent region by which laser light that has been oscillated from the said semiconductor laser devices is absorbed, and in order to prevent this phenomenon, the thickness of the cladding layers must be set to be as great as possible so that light that has penetrated from the active layer into the cladding layers cannot arrive at the said light-absorbent region such as the substrate and/or the cap layer. For this reason, the thicknesses of both the p-sided and n-sided cladding layers of the conventional DH-type semiconductor laser devices are set at as great as 1 $\mu$m or more (e.g., about 1.5 $\mu$m). The DH-type semiconductor laser devices are generally provided with the active layer with a thickness of 0.01 $\mu$m or less, the cap layer with a thickness of 0.51-1 $\mu$m, and the cladding layers with the above-mentioned thicknesses. Moreover, when molecular beam epitaxy is used, the DH-type semiconductor laser devices are occasionally designed to have a GaAs buffer layer with a thickness of 0.5 $\mu$m or more. Accordingly, when the DH-type semiconductor laser devices are produced by molecular beam epitaxy, if the AlAs mole fractions of the cladding layers and the active layer, respectively, are set of 0.45 and 0.15 and if the growth rates of the GaAs crystal layers and the $Al_{0.45}Ga_{0.55}As$ crystal layers, respectively, are set at 0.7 $\mu$m/hour and 1.56 $\mu$m/hours, it will take at shortest about 3.5 hours to complete the growth of crystals. This means that the productivity of DH-type semiconductor laser devices is slow. Moreover, when molecular beam epitaxy is used, an increase in the thickness of grown layers gives rise to an increase in the density of the surface defects, which causes deterioration of the device characteristics and a decrease in the production yield.

Moreover, in conventional DH-type semiconductor laser devices, the thickness of the active layer is set at as small as about 0.1 $\mu$m (preferably 0.07 $\mu$m or less) so as to attain laser oscillation at a low threshold current level and attain excellent optical characteristics. In conventional semiconductor laser devices with the DH structure, not only the active layer is made very thin, but also the changes of the refractive index only arise at the interface between the active layer and each cladding layer, so that light does not decay within the active layer but it decays within the cladding layers to a large extent. Thus, in order to prevent detrioration of the device characteristics, as described above, the thickness of each cladding layer must be set at as great as about 1.5 $\mu$m. Even when an optical guiding layer is disposed between the active layer and each cladding layer, if the distribution of the refractive index of the said optical guiding layers is uniform within the said optical guiding layers, the changes in the refractive index only arise at the interface between the active layer and each optical guiding layer and at the interface between each optical guiding layer and each cladding layer. Thus, although leakage of light from the active layer into the cladding layer can be suppressed to a certain extent, it still occurs and light exists to a large extent within the cladding layers. Therefore, to make the cladding layers thin causes deterioration of the device characteristics. Especially, in quantum well laser devices that have a very thin active layer by which laser oscillation can be attained at a low threshold current level, the distribution of light is unaffected by the quantum well, so that the distribution of light of the quantum well laser devices becomes nearly equivalent to that of DH-type laser devices with the active layer having a thickness that corresponds to the thickness of [one optical guiding layer] plus [the active layer] plus [the other optical guiding layer] of the said quantum well laser devices. Therefore, a large amount of light leaks from the active layer to the cladding layers, as well, in the quantum well laser devices.

SUMMARY OF THE INVENTION

The semiconductor laser device of this invention, which overcomes the above-discussed and numerous other disadvantages and deficiencies of the prior art, comprises an active layer, optical guiding layers sandwiching said active layer therebetween, and a cladding layer disposed on each of said optical guiding layers, wherein the refractive index of each of said optical guiding layers gradually varies in the direction of the thickness of said optical guiding layer, and the thickness of each of said cladding layers is set to be 0.5 um or less.

In a prefered embodiment, the active layer has a thickness of 0.1 $\mu$m or less.

In a preferred embodiment, each of the cladding layers is made of $Al_x Ga_{1-x}As$ and the AlAs mole fraction X is set at 0.45 or more.

Thus, the invention described herein makes possible the objectives of (1) providing a semiconductor laser device in which leakage of light from the active layer into the cladding layers is minimized so that the thickness of each cladding layer can be set at as small as 0.5 $\mu$m or less without deteriorating the device characteristics, thereby attaining an improvement of both the productivity and the production yield; and (2) providing a semiconductor laser device in which the density of crystal defects is decreased, resulting in an improvement of the device characteristics.

BRIEF DESCRIPTION OF THE DRAWINGS

This invention may be better understood and its numerous objects and advantages will become apparent to those skilled in the art by reference to the accompanying drawings as follows:

FIG. 1 is a sectional view showing a semiconductor laser device of this invention.

FIG. 2A is of a graph showing the optical intensity in the vicinity of the active layer of the semiconductor laser device of this invention shown in FIG. 1.

FIG. 2B is a graph showing the optical intensity in the vicinity of the active layer of an ordinary DH-structure semiconductor laser device.

DESCRIPTION OF THE PREFERRED EMBODIMENTS

This invention provides a semiconductor laser device with optical guiding layers, the refractive index of which is continuously changed in the direction of the thickness of the optical guiding layers. Since the refractive index of the optical guiding layers is continuously changed in the above-mentioned manner, light that is being propagated within the resonator of the laser device is refracted by the law of refraction while being propagated from the high refractive index portion of each of the optical guiding layers to the low refractive index portion of each of the optical guiding layers, and thus the light gradually becomes parallel to the direction of the resonator and finally attains a total reflection. Accordingly, the light is confined to a large extent within the optical guiding layers, resulting in a very slight leakage of light from the optical guiding layers into the cladding layers. Such a phenomenon occurs effectively with an increase in the changes of the refractive index within the optical guiding layers, and thus it is possible that the refractive index of the cladding layers is set to be as small as possible. That is, when an $Al_xGa_{1-x}As$ compound semiconductor is used for the cladding layers, the AlAs mole fraction x can be set to be as great as possible. Especially, when the AlAs mole fraction x is set at 0.45 or more, an excellent light-confining effect can be achieved in the optical guiding layers.

As mentioned above, leakage of light from the optical guiding layers into the cladding layers is minimized by the use of the optical guiding layers that have a gradient refractive index distribution therein, and even when the thickness of each of the cladding layers is made thin, there is no possibility that the light leaks from the active layer into the substrate and/or the cap layer via each of the cladding layers (that is, absorptive loss of light due to the substrate and/or the cap layer does not occur). Even when the thickness of each of the cladding layers is set at 0.5 μm or less, deterioration of the device characteristics does not arise.

EXAMPLE

FIG. 1 shows a semiconductor laser device of this invention, which comprises an active layer that is sandwiched by a pair of optical guiding layers with a gradient refractive index distribution. The crystal growth of this semiconductor laser device is carried out by molecular beam epitaxy, wherein the growth rates of GaAs and $Al_{0.7}Ga_{0.3}As$ are set at 0.45 μm/hour and 1.5 μm/hour, respectively. The production process of this laser device is as follows: ON an n-GaAs substrate 1, an n-GaAs buffer layer 2 with a thickness of 0.45 μm, an n-$Al_{0.7}Ga_{0.3}As$ first cladding layer 3 with a thickness of 0.45 μm, an n-$Al_yGa_{1-y}As$ optical guiding layer 4 with a thickness of 0.2 μm (wherein the value of y is gradually reduced from 0.7 to 0.2; that is, the said optical guiding layer has a gradient refractive index or a gradient composition), a GaAs active layer (a quantum well layer) 5 with a thickness of 0.01 μm, a p-$Al_zGa_{1-z}As$ optical guiding layer 6 with a thickness of 0.2 μm (wherein the value of z is gradually changed from 0.2 to 0.7; that is, the said optical guiding layer has a gradient refractive index or a gradient composition), a p-$Al_{0.7}Ga_{0.3}As$ second cladding layer 7 with a thickness of 0.45 μm, and a p-GaAs cap layer 8 with a thickness of 0.45 μm are successively grown by molecular beam epitaxy. It takes about 3 hours to complete the crystal growth, which is two thirds the time needed to complete a reference standard semiconductor laser device having the first and second cladding layers with an ordinary thickness of 1.5 μm. Moreover, since the thickness of the grown layers of the laser device of this example can be made remarkably small, the density of crystal defects is reduced, which causes an improvement of the life of the laser device and an improvement of the production yield of the laser device.

The refractive index in the vicinity of the active layer 5 and the optical guiding layers 4 and 6 gradually varies as illustrated in FIG. 1. Although this example discloses that the gradient refractive index distribution varies according to the parabolic distribution, it is not limited thereto. The refractive index can also be stepwise changed. Moreover, although this example discloses that the AlAs mole fraction of the cladding layers is set at a value of as great as 0.7 and the growth rate is set at a slightly low level, when the said AlAs mole fraction of the cladding layers is set at a small value so as to set the said growth rate at the same level as that of an ordinary DH-structure semiconductor laser device, the period of time for the growth of the layers is shortened by about 2.5 hours. Nevertheless, the AlAs mole fraction of the cladding layers is preferably set at a value of 0.7 in light of the device characteristics.

FIG. 2A shows the optical intensity distribution in the vicinity of the active layer 5, the optical guiding layers 4 and 6, and the cladding layers 3 and 7 of the semiconductor laser device of this example, which indicates that the optical intensity is the strongest in the active layer 5 and steeply decreased from the interface between the active layer 5 and each of the optical guiding layers 4 and 6 to the interface between each of the optical guiding layers 4 and 6 and each of the cladding layers 3 and 7. The optical intensity is significantly low in the cladding layers 3 and 7. FIG. 2B shows the optical intensity distribution of an ordinary DH-structure semiconductor laser device, as a reference standard laser device, in which the active layer 5 is directly sandwiched by the cladding layers 3 and 7 without using the optical guiding layers, indicating that a large amount of light leaks from the active layer into the cladding layers 3 and 7.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising an active layer, optical guiding layers sandwiching said active layer therebetween, and a cladding layer disposed on each of said optical guiding layers, the device wherein the refractive index of each of said optical guiding layers gradually increases in the direction away from said active layer substantially identically, and the thickness of each of said cladding layers is 0.5 um or less.

2. A semiconductor laser device according to claim 1, wherein said active layer has a thickness of 0.1 $\mu$m or less.

3. A semiconductor laser device according to claim 1, wherein each of said cladding layers is made of $Al_xGa_{1-x}As$ and the AlAs mole fraction X is set at 0.45 or more.

* * * * *

UNITED STATES PATENT AND TRADEMARK OFFICE
CERTIFICATE OF CORRECTION

PATENT NO. : 4,862,470
DATED : 29 August 1989
INVENTOR(S) : Suyama et al.

It is certified that error appears in the above-identified patent and that said Letters Patent is hereby corrected as shown below:

In column 6, line 2: substitute "increases" with --decreases--

Signed and Sealed this

Ninth Day of March, 1993

Attest:

STEPHEN G. KUNIN

*Attesting Officer*     *Acting Commissioner of Patents and Trademarks*